(12) United States Patent
Tschirbs et al.

(10) Patent No.: US 7,910,952 B2
(45) Date of Patent: Mar. 22, 2011

(54) POWER SEMICONDUCTOR ARRANGEMENT

(75) Inventors: Roman Tschirbs, Soest (DE); Reinhold Bayerer, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 572 days.

(21) Appl. No.: 11/863,463

(22) Filed: Sep. 28, 2007

(65) Prior Publication Data

US 2008/0079145 A1     Apr. 3, 2008

(30) Foreign Application Priority Data

Sep. 28, 2006   (DE) .......................... 10 2006 045 939

(51) Int. Cl.
*H01L 23/48*         (2006.01)

(52) U.S. Cl. . 257/177; 257/706; 257/718; 257/E23.106; 257/E23.084; 257/E23.051

(58) Field of Classification Search .................. 257/703, 257/706, 718, 720, 722, 727, E23.083, E23.084, 257/E23.086, E23.106, E23.051
See application file for complete search history.

(56) References Cited

U.S. PATENT DOCUMENTS

| | | | |
|---|---|---|---|
| 5,602,720 A * | 2/1997 | Natsuhara et al. | 361/708 |
| 6,261,703 B1 | 7/2001 | Sasaki et al. | |
| 6,844,621 B2 | 1/2005 | Morozumi et al. | |
| 2004/0022029 A1 * | 2/2004 | Nagatomo et al. | 361/709 |
| 2007/0147005 A1 * | 6/2007 | Harada et al. | 361/709 |

FOREIGN PATENT DOCUMENTS

| | | |
|---|---|---|
| DE | 19707514 | 8/1998 |
| WO | 0108219 | 2/2001 |
| WO | WO 2005091363 A1 * | 9/2005 |

* cited by examiner

*Primary Examiner* — Minh-Loan T Tran
*Assistant Examiner* — Leslie Pilar Cruz
(74) *Attorney, Agent, or Firm* — Dicke, Billig & Czaja, PLLC

(57) ABSTRACT

One aspect relates to a power semiconductor arrangement includes a power semiconductor module which is mechanically connected to a heat sink. In order to improve the thermal cycling stability of the connection between a baseplate of the module and a circuit carrier connected thereto, recesses are provided in the baseplate. One aspect further relates to a power semiconductor module.

23 Claims, 15 Drawing Sheets

200 cycles (Cu)

1000 cycles (Cu)

2000 cycles (Cu)

4000 cycles (Cu)

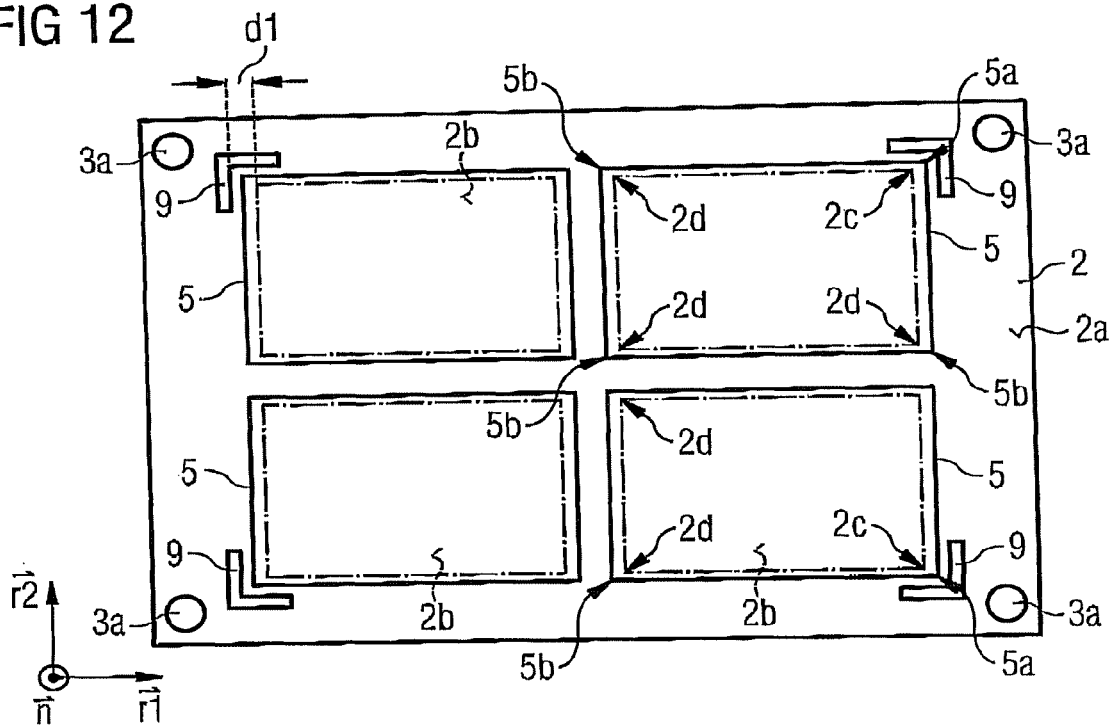
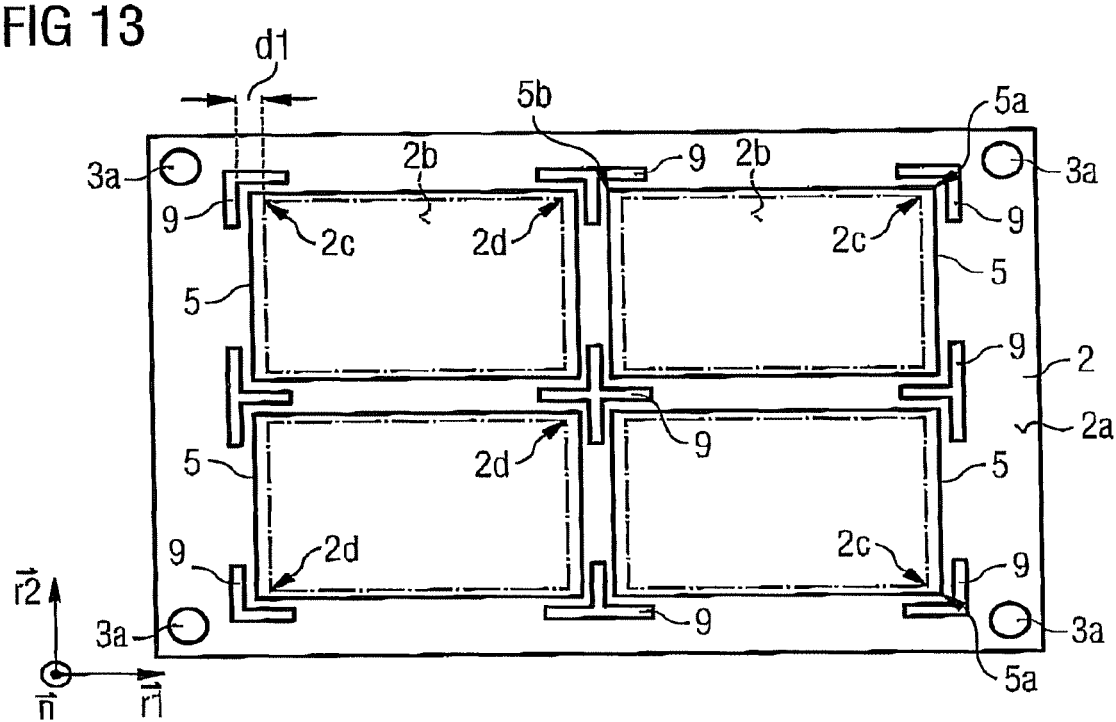

POWER SEMICONDUCTOR ARRANGEMENT

CROSS-REFERENCE TO RELATED APPLICATIONS

This Utility Patent Application claims priority to German Patent Application No. DE 10 2006 045 939.3, filed on Sep. 28, 2006, which is incorporated herein by reference.

BACKGROUND

One aspect relates to power semiconductor arrangements including a power semiconductor module mechanically connected to a heat sink.

Power semiconductor modules may include a base plate and at least one, at least two, or more semiconductor chips that are generally arranged on a circuit carrier. One or more circuit carriers equipped in this way are in turn fixedly connected to the baseplate. To form a power semiconductor arrangement, the power semiconductor module may be mechanically pressed against a heat sink with the baseplate ahead.

An exemplary embodiment of such a power semiconductor module is illustrated in FIG. 1. The power semiconductor module 1 exhibits a semiconductor chip 6 including a semiconductor body 60 provided with metallizations 61, 62 on two opposite sides. The first metallization 61 is generally structured and divided at least into control and load current contacts. Furthermore, the power semiconductor module 1 includes a circuit carrier 5 including a dielectric carrier 50 provided with a structured first metallization layer 51 on one side and with a second metallization layer 52 on the opposite side.

The semiconductor chip 6 is connected by its metallization 62 to a portion of the structured metallization 51 of the circuit carrier 5 by means of an electrically conductive connecting layer 71, for example, a solder layer or an NTC layer (NTC=low-temperature connection).

Furthermore, the first metallization 61 of the semiconductor chip 6 is connected to a further portion of the structured metallization layer 51 of the circuit carrier 5 by means of bonding wires 7. As an alternative to a bonding connection, it is also possible to provide metal clips, for example, which are connected to the first metallization 61 by means of a soldering or low-temperature connection.

The circuit carrier 5 serves, on the one hand, for electrically interconnecting one or more semiconductor chips 6 arranged thereon, and, on the other hand, the heat loss arising in the semiconductor chip 6 is dissipated via it. This results in the necessity of using materials including good thermal conductivity for the circuit carrier 5.

In order to increase the thermal cycling stability of the first solder layer 71, the coefficients of thermal expansion of the circuit carrier 5 and of the semiconductor chip 6 differ as little as possible. Since the coefficient of thermal expansion of the semiconductor chip 6 is essentially determined by the low coefficient of thermal expansion of the semiconductor body 60, DCB substrates (DCB=Direct Copper Bonding), DAB substrates (DAB=Direct Aluminum Bonding) or AMB substrates (AMB=Active Metal Brazed) are usually used as circuit carrier 5 since they likewise include a low coefficient of thermal expansion.

Two or more circuit carriers 5 equipped in this way are fixedly connected to a baseplate 2 by means of a second connecting layer 72 at their second metallization layer 52. Baseplates of this type may, for example, wholly or partly include a metal such as, for example, copper or aluminum and therefore include a coefficient of thermal expansion that differs comparatively greatly from the coefficient of thermal expansion of the circuit carrier 5.

Since the heat arising in the semiconductor chip 6 is dissipated via the circuit carrier 5, the second connecting layer 72 and the baseplate 2 to a heat sink 4 that may be connected to the power semiconductor module 1, during operation of the power semiconductor module 1 in the case of frequent temperature changes severe thermal cycling loading occurs in the second connecting layer 72.

On account of the different coefficients of the thermal expansion of the baseplate 2 and of the circuit carrier 5, von-Mises stresses act in the second connecting layer 72 and load the second connecting layer 72. Cracking can thereby commence in the second connecting layer 72 depending on the number of temperature cycles undergone and on the temperature differences that occur, whereby the heat dissipation from the semiconductor chip 6 in the direction of the heat sink 4 is impaired. This in turn brings about an increase in the temperature in the semiconductor chip 6, whereby the second connecting layer 72 is loaded to an even greater extent.

Further loading of the second connecting layer 72 arises as a result of mechanical stresses which occur at fixing locations 3 for fixing the baseplate 2 and hence the power semiconductor module 1 at a heat sink 4.

FIG. 2 illustrates a perspective view of a quarter model of a baseplate 2, which is equipped with 3 circuit carriers in this example, to which baseplate a circuit carrier 5 is fixedly connected by means of a connecting layer 72.

A fixing location 3 formed as a continuous opening is provided in the region of an outer corner of the baseplate 2, by means of which fixing location the baseplate 2 may be fixed at a heat sink.

What is problematic in this case is the stability of the connecting layer 72 in its portions 72a located in the region of the outer corners 5a of the circuit carriers 5. In this case, an outer corner 5a of the circuit carrier 5 is understood to mean a corner adjacent to which no other circuit carrier is arranged. Likewise problematic is the thermal cycling stability of the second connecting layer 72 in its portions 72b arranged in the region of the inner corners 5b of the circuit carrier 5. In this case, an inner corner 5b of the circuit carrier 5 is understood to mean a corner in the vicinity of which another circuit carrier 5 is arranged.

FIGS. 3A and 3B illustrate the von-Mises stresses—on that side of the second connecting layer 72 in accordance with FIGS. 1 and 2 which faces the baseplate 2 (FIG. 3A) and the substrate 5 (FIG. 3B).

It can be seen therefrom that peaks of the von-Mises stresses occur below the outer corners 5a in regions 72a of the second connecting layer 72 and below the inner corners 5b in regions 72b of the second connecting layer 72.

On account of the cracking associated therewith, progressive delamination of the circuit carrier 5 from the baseplate 2 occurs during operation of the power semiconductor module 1. The delamination begins in the region of the portions 72a, 72b of the second connecting layer 72 owing to the peak values of the von-Mises stresses that occur there.

FIG. 4 illustrates such delamination effects on the basis of ultrasound examinations using the example of a power semiconductor module onto whose baseplate four circuit carriers are soldered, after 200 (FIG. 4A), 1000 (FIG. 4B), 2000 (FIG. 4C) and 4000 (FIG. 4D) temperature cycles. The locations at which the delamination occurs are represented dark in FIGS. 4A to 4D and identified by the reference symbol 72c.

FIG. 4 reveals that the delamination commences in the corner regions 72a, 72b (see FIG. 4B) and propagates toward the center of the respective circuit carriers as the number of temperature cycles increases.

FIG. 5 illustrates the profile of the von-Mises stresses σ on that side of the second connecting layer which faces the baseplate in the region of an outer corner 72a, at which the von-Mises stresses including a maximum value of 26.7 MPa.

FIG. 6 illustrates a cross section through a power semiconductor module in the region of the interface between the second metallization layer 52 of the dielectric carrier and the second connecting layer 72 in cross section. It can be seen therefrom that the second connecting layer 72 includes a crack 72c in the region of its side facing the second metallization layer 52.

SUMMARY

A power semiconductor module according to one embodiment includes a baseplate and a circuit carrier, which is fixedly connected to the baseplate by means of a connecting layer. The baseplate includes a connecting area given by a common interface between the connecting layer and the baseplate, and also a fixing location, by means of which the baseplate may be connected to a heat sink. In order to reduce the von-Mises stresses acting in the connecting layer, a recess is provided, which is arranged in a lateral direction between the fixing location and the connecting area and which extends into the baseplate proceeding from that side of the baseplate which faces the circuit carrier.

The recess may be formed as a non-continuous trench or as a continuous opening of the baseplate and amount to a depth of 1 mm or more. In the case of a non-continuous trench, the recess may include, for example, a depth of at least 30% of the thickness of the baseplate.

Such a recess includes an effect when it is arranged between a fixing location and a location at which the edge of the connecting area falls below a predetermined radius of curvature, for example between 0 mm and 10 mm.

The width of the recess may be, for example, 10% to 100% of the thickness of the baseplate or 0.5 mm to 5 mm.

In accordance with one embodiment, such a recess may be arranged in ring-shapedly closed fashion around the connecting area.

In order to reliably reduce the mechanical stresses that occur, the distance between the connecting area and the recess in the lateral direction is chosen to be less than or equal to a predetermined value, for example less than or equal to 3 mm.

On account of the reduction of the thermomechanical stresses that is associated with the recess, the distance between the fixing location and the connecting area in the lateral direction may be chosen to be relatively small, for example, less than or equal to 3 mm.

In order to reduce the thermomechanical stresses of the fixing location between the circuit carrier and the baseplate, in addition or as an alternative provision may be made for arranging a fixing location of the baseplate below the circuit carrier. In this case, the fixing location may be arranged in a region in which the baseplate includes a concave precurvature on its side remote from the circuit carrier.

Furthermore, in addition or as an alternative the baseplate may also include a convex precurvature on its side remote from the circuit carrier.

In power semiconductor modules according to embodiments, the fixing location may be formed as a continuous opening of the baseplate.

A fixing location may likewise be given by a location at which the baseplate is connected to a bolt in a releasable or non-releasable manner or at which it includes a projection formed as a fixing element.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings:

FIG. 12 illustrates a plan view of the front side of a baseplate of a power semiconductor module on which four circuit carriers are arranged and which includes four fixing holes, wherein a recess is arranged in the baseplate between in each case an outer corner of a circuit carrier and a fixing location.

FIG. 13 illustrates the plan view of the baseplate of a power semiconductor module in accordance with FIG. 10 in which the baseplate includes additional recesses arranged in the region of the inner corners of the circuit carriers.

In the figures, identical reference symbols designate identical elements including an identical function. For the sake of better illustration, the exemplary embodiments are not reproduced true to scale.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 7:
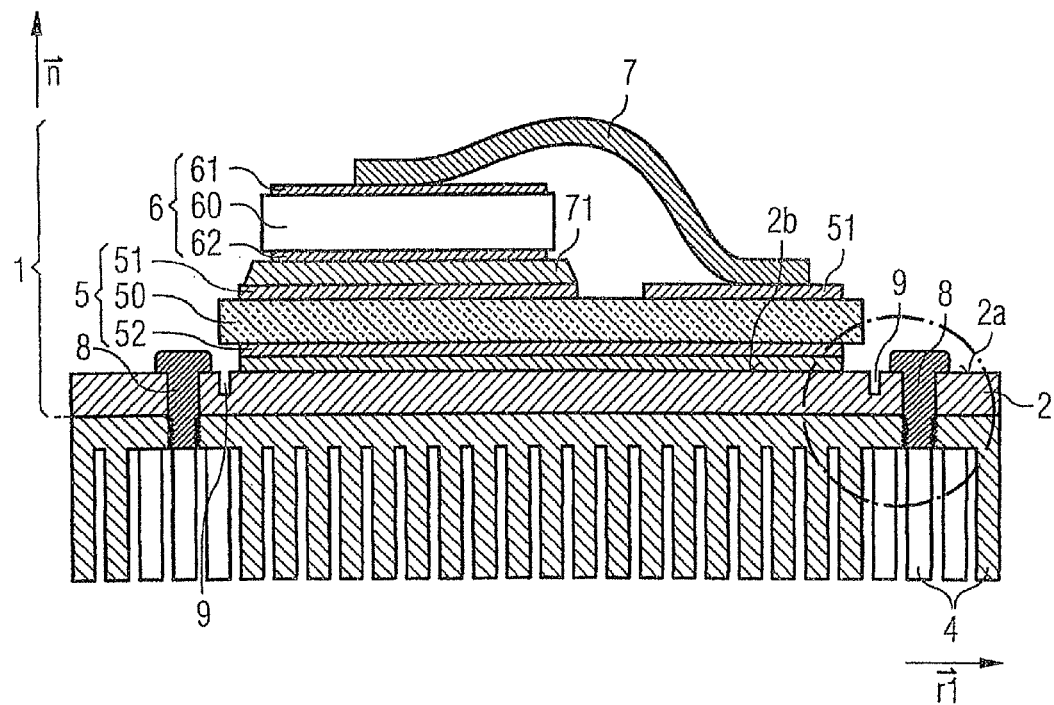
FIG. 7 illustrates a cross section through a power semiconductor module, which is connected to a heat sink and in which a recess is provided between a connecting area formed between a connecting layer and the baseplate and a fixing location for fixing the baseplate at a heat sink, said recess extending into the baseplate proceeding from that side of the baseplate which faces the circuit carrier, wherein the fixing location is fixedly established by a screw that is screwed into a blind hole provided with an internal thread in the heat sink.

FIG. 7 illustrates a cross section through a power semiconductor module 1 according to the embodiment, which is mounted at a heat sink 4 by means of fixing screws 8. The power semiconductor module 1 includes a circuit carrier 5 including a dielectric carrier 50 including a structured first metallization layer 51 and a second metallization layer 52, which are arranged on mutually opposite sides of the dielectric carrier 50. The dielectric carrier 50 may be formed, for example, from ceramic or plastic. The circuit carrier 5 may be for example a DCB substrate, a DAB substrate or an AMB substrate.

A semiconductor chip 6 is connected to a portion of the first metallization layer 51 by means of a first connecting layer 71, for example composed of a solder or composed of an electrically conductive adhesive. The semiconductor chip 6 includes a semiconductor body 60 and also a first metallization 61 and a second metallization 62, which are arranged on mutually opposite sides of the semiconductor body 60. The semiconductor chip 6 is connected at its first metallization layer 61 to a further portion of the structured first metallization layer 51 by means of a bonding wire 7.

The circuit carrier 5 equipped with the semiconductor chip 6 is connected via its second metallization layer 52 to a connecting area 2b of a baseplate 2 by means of a second connecting layer 72. The connecting area 2b is a partial area of that side of the baseplate 2 which is also referred to hereinafter as front side 2a, on which the circuit carrier 5 is fixed. Since the heat loss arising in the semiconductor chip 6 is dissipated via the connecting area 2b, the connecting area is chosen to include the largest possible area.

The connection between the circuit carrier 5 and the baseplate 2 may be produced, for example, by soldering, by means of a thermally conductive adhesive, or by means of a low-temperature connection method.

The baseplate 2 may consist of, for example, copper and/or aluminum silicon carbide (AlSiC), or may include at least one of said materials. Furthermore, the baseplate 2 includes fixing locations 3, by means of which the baseplate and hence the entire power semiconductor module 1 may be fixed at a heat sink 4.

Fixing location in the sense of the present embodiment is understood to mean any location of the baseplate 2 which is provided for allowing a force for pressing the baseplate 2 onto the heat sink 4 to act on the baseplate 2. In the exemplary embodiment in accordance with FIG. 7, the fixing locations 3 are formed as continuous openings of the baseplate 2 and are spaced distant from the second connecting layer 72 in a first lateral direction r1, which is perpendicular to a direction of the normal n to the front side 2a.

A recess 9 is provided in the first lateral direction r1 between the fixing location 3 and the second metallization layer 52, said recess extending into the baseplate 2 proceeding from the front side 2a of the baseplate 2. The recess 9 may be formed, as illustrated in FIG. 7, as a non-continuous trench or else—as not illustrated in FIG. 7—as a continuous opening in the baseplate 2.

Figure 8:
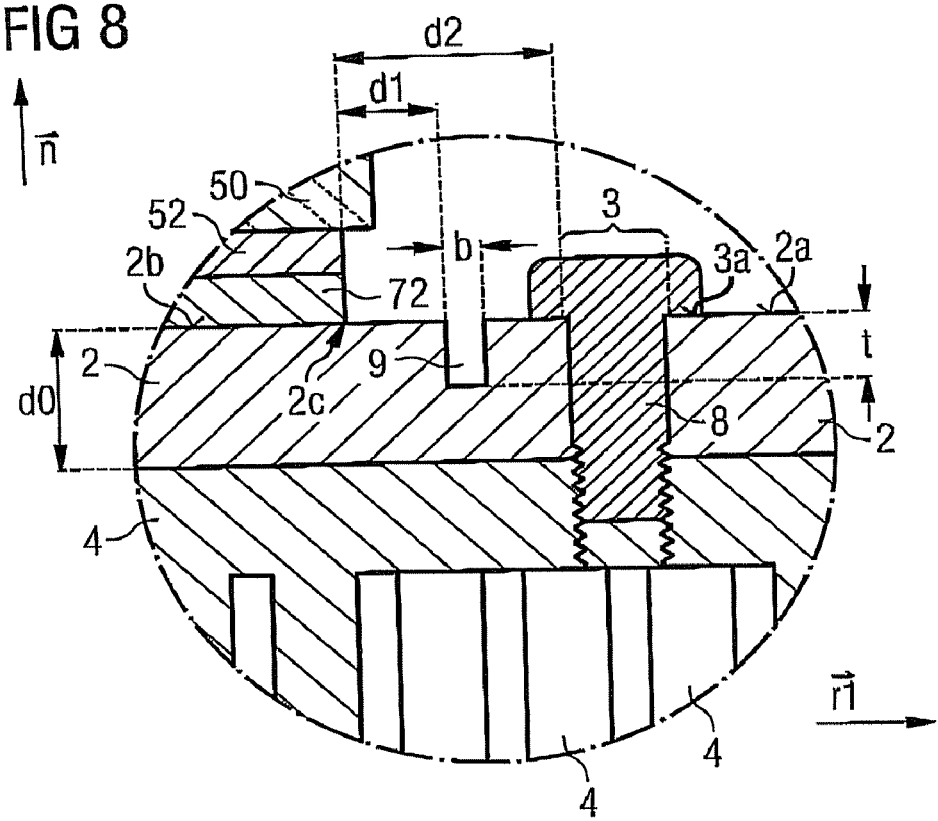
FIG. 8 illustrates an enlarged excerpt from the arrangement in accordance with FIG. 7, with the difference that the screw is screwed into a blind hole provided with an internal thread in the heat sink.

An enlarged excerpt from the arrangement in accordance with FIG. 7 is illustrated in FIG. 8. It can be seen therefrom that the recess 9 extends right into a depth t proceeding from the front side 2a of the baseplate 2. The recess 9 includes a width b and is at a distance d1 from the connecting area 2b in the first lateral direction r1. Furthermore, the baseplate 2 includes a thickness d0.

As can be seen from FIG. 8, the heat sink 4 may be fixed to the baseplate 2 and hence to the entire power semiconductor module 1 by means of a fixing means 8, which is formed as a screw, by way of example, which engages into the internal thread of a blind hole formed in the heat sink 4. Since the force with which the baseplate 2 is pressed onto the heat sink 4 proceeds from the head of the screw, the fixing location is given by that region of the baseplate 2 which is given within the lateral boundary of the bearing area 3a of the screw head on the baseplate 2. In this case, the fixing location 3 extends over the entire thickness of the baseplate 2 in the direction of the normal n.

FIG. 8 furthermore illustrates that the second metallization layer 52 and the second connecting layer 72 may be spaced distant from the lateral edge of the dielectric carrier 50 in the lateral direction.

Figure 9:
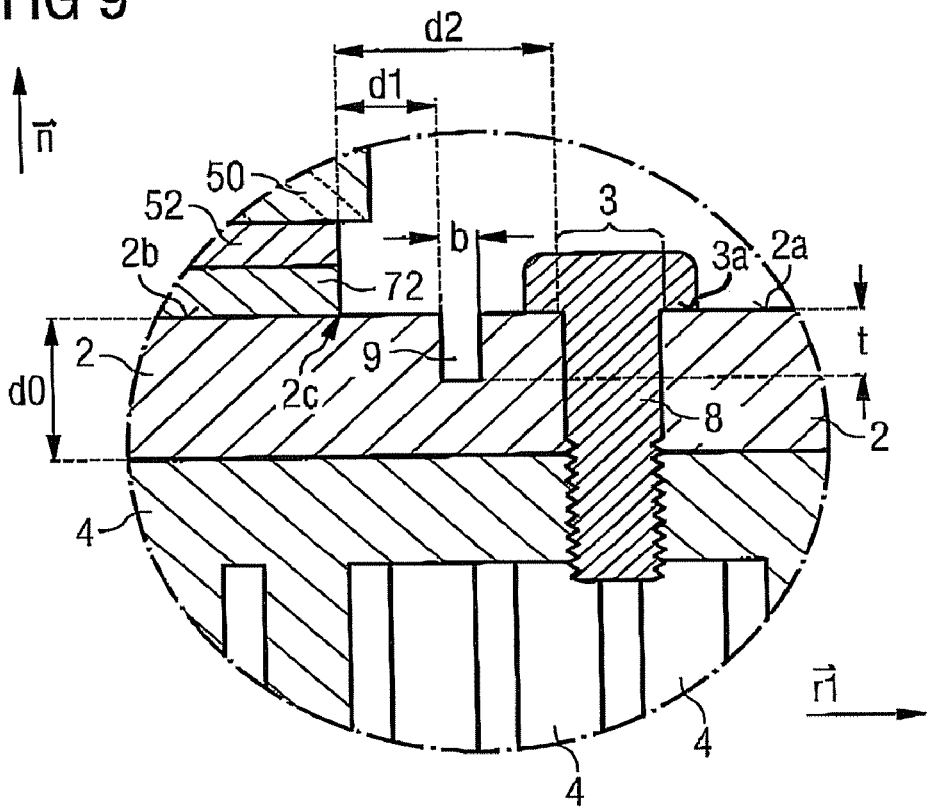
FIG. 9 illustrates an enlarged excerpt from a power semiconductor module according to the embodiment in accordance with FIG. 8 with the difference that instead of the blind hole a continuous opening is provided in the heat sink.

FIG. 9 illustrates an enlarged excerpt from an arrangement corresponding to FIGS. 7 and 8 with the difference that instead of the blind hole a continuous opening with an internal thread is provided in the heat sink 4.

Figure 10:
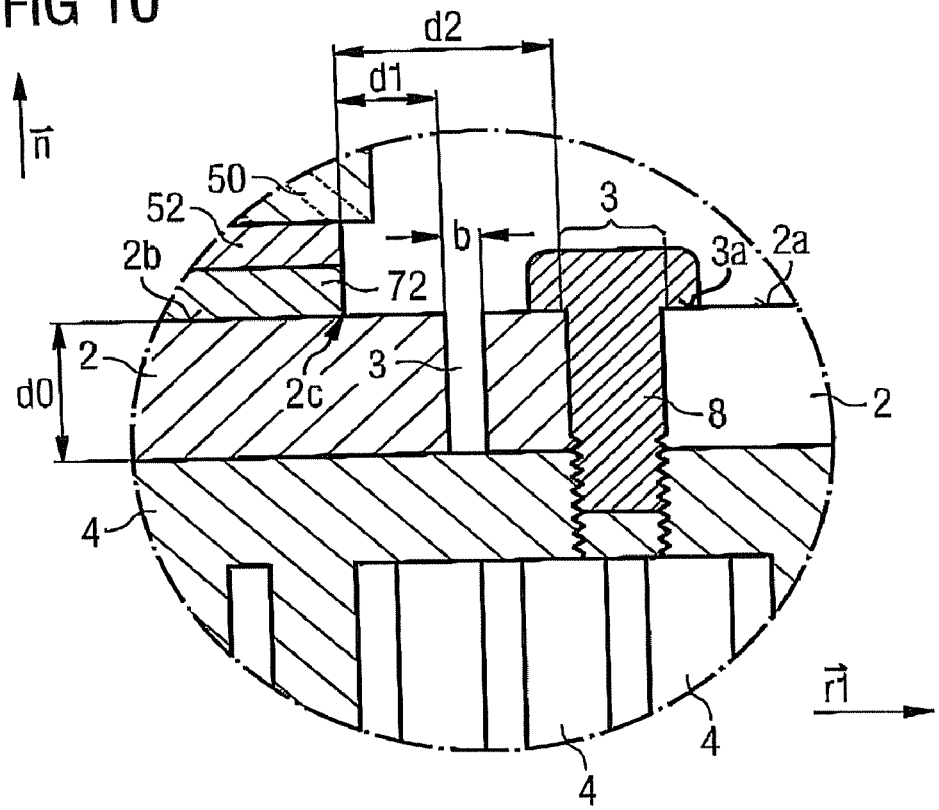
FIG. 10 illustrates an enlarged excerpt from the arrangement in accordance with FIG. 8 with the difference that the recess is formed as a continuous opening in the baseplate.
Figure 11:
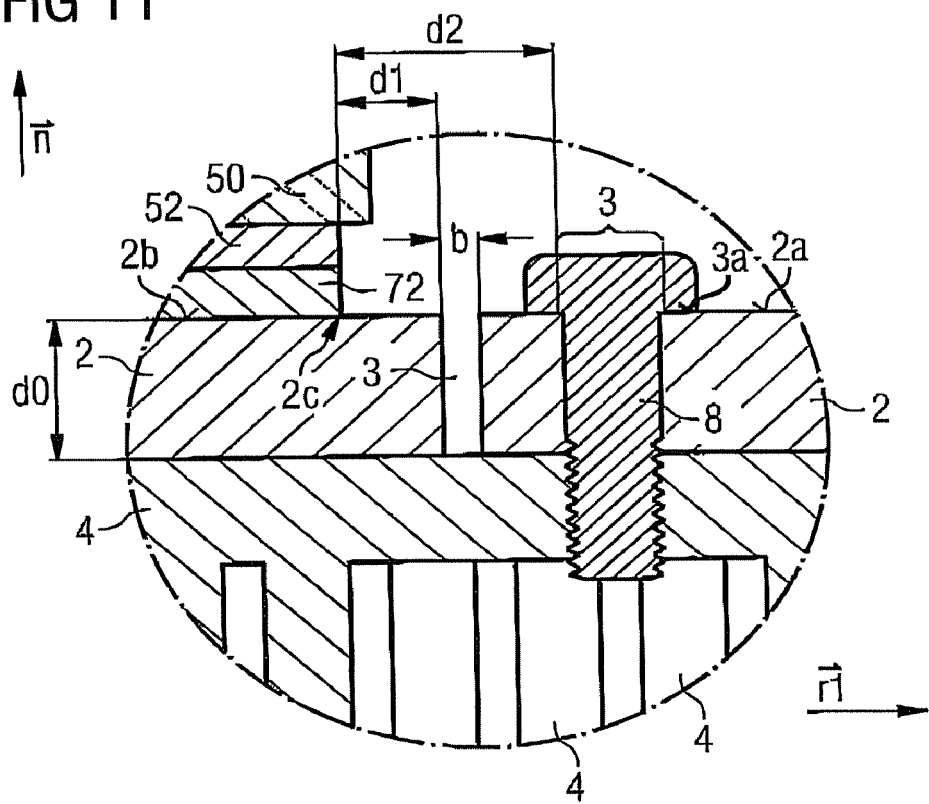
FIG. 11 illustrates an enlarged excerpt from the arrangement in accordance with FIG. 9 with the difference that the recess is formed as a continuous opening in the baseplate.

FIG. 10 corresponds to the arrangement in accordance with FIG. 8, and FIG. 11 corresponds to the arrangement in accordance with FIG. 9, in each case with the difference that the recess 9 is not formed as a non-continuous trench but rather as a continuous opening in the baseplate 2.

In power semiconductor modules 1 according to the embodiment, the depth t of the recess 9 may be for example at least 30% of the thickness d0 of the baseplate 2 or at least 1 mm. Moreover, the recess 9 may include, for example, a width of 10% to 100% of the thickness d0 of the baseplate 2. The distance d1 may be chosen to be, for example, less than or equal to 3 mm.

Instead of or in addition to a screw connection, the connection between the baseplate 2 and the heat sink 4 may, for example, also be produced by means of a spring clip or by means of any other connecting element.

FIG. 12 illustrates a plan view of a baseplate 2 of a power semiconductor module 1 in accordance with an embodiment which is equipped with circuit carriers 5. The baseplate 2 includes an essentially rectangular basic area and includes a fixing location 3 in each corner region. The circuit carriers 5 are fixed in two rows and two columns next to one another on the baseplate 2.

The circuit carriers 5 also include essentially rectangular basic areas. Each of the circuit carriers 5 includes one outer corner 5a and also three inner corners 5b.

The connecting areas 2b situated below the circuit carriers 5 are illustrated by broken lines. Each connecting area 2b includes an outer corner 2c corresponding to the outer corner 5a of the circuit carrier 5 connected to it. Moreover, each connecting area 2b includes inner corners 2d corresponding to the inner corners 5b of the circuit carrier 5 connected to it.

In the region of each of the outer corners 5a of the circuit carriers 5 a recess 9 is provided in the baseplate 2, said recess being arranged between an outer corner 2c of the connecting area 2b and a fixing location 3 situated closest to the relevant outer corner 2c. The recesses 9 are spaced distant from the second connecting layer 72 in the first lateral direction r1 and in a second lateral direction r2, which is perpendicular to the first lateral direction r1 and to the direction of the normal n. As an alternative to this, a recess 9 may also adjoin a connecting area 2b.

Each of the recesses 9 runs in a predetermined angular range continuously around the outer corner 2c situated closest to it of the connecting area 2b situated closest to it.

The exemplary embodiment in accordance with FIG. 13 corresponds to the exemplary embodiment in accordance with FIG. 12 with the difference that in addition to the recesses 9 in the region of the outer corners 2c of the connecting areas 2b, recesses 9 are also provided which are arranged around inner corners 2d of the respective connecting area 2b which correspond to the inner corners 5b of the circuit carriers 5.

The recesses 9 of the baseplate 2 which are arranged in the region of the outer corners 2c may be formed in angular fashion in the plan view of the baseplate 2 as illustrated and include two limbs running perpendicular to one another. Depending on the concrete arrangement of the circuit carriers 5 on the baseplate 2, the recesses 9 of the baseplate 2 which are arranged in the region of the inner corners 5b may be formed in T-shaped or cruciform fashion in the plan view of the baseplate 2 as illustrated by way of example.

Figure 14:
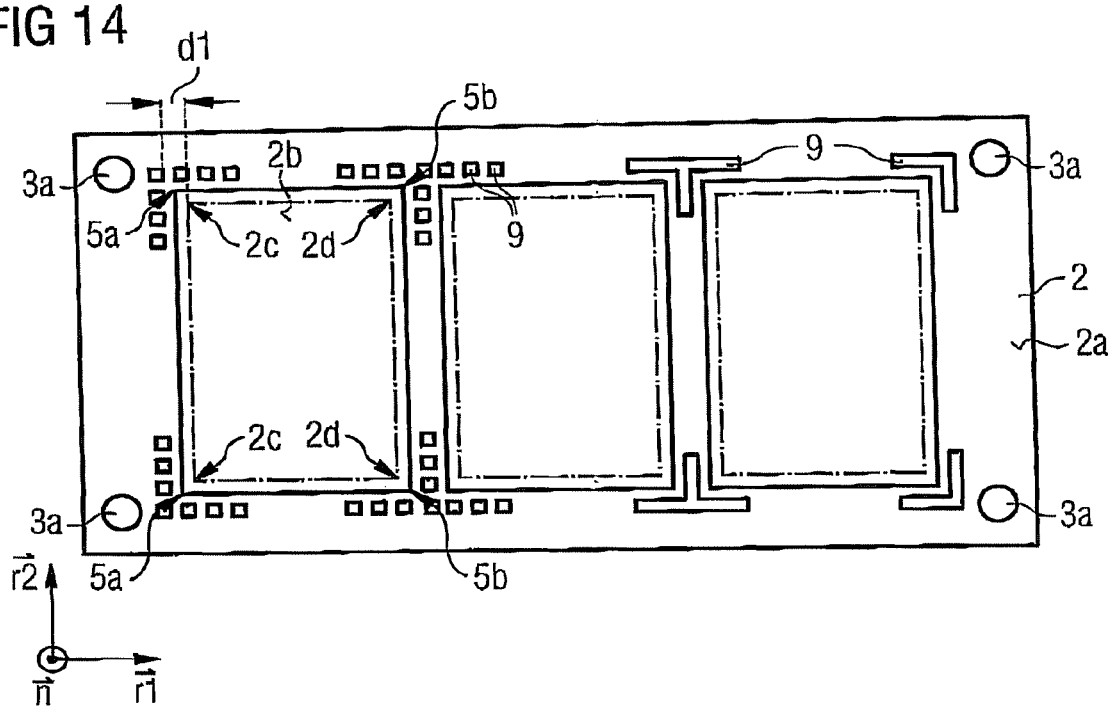
FIG. 14 illustrates a plan view of a baseplate of a power semiconductor module with three circuit carriers connected to a baseplate, in which a plurality of recesses are arranged in a manner spaced distant from one another in the region of an inner corner and in the region of an outer corner.

FIG. 14 illustrates a plan view of a baseplate 2 of a power semiconductor module according to an embodiment on which three circuit carriers 5 arranged next to one another in a row are fixed.

The left-hand half of FIG. 14 illustrates by way of example that instead of one recess 9 arranged in the region of an outer corner 2c or an inner corner 2d, it is also possible for a plurality of recesses 9 to be arranged in a manner spaced distant from one another in the baseplate 2.

Figure 15:
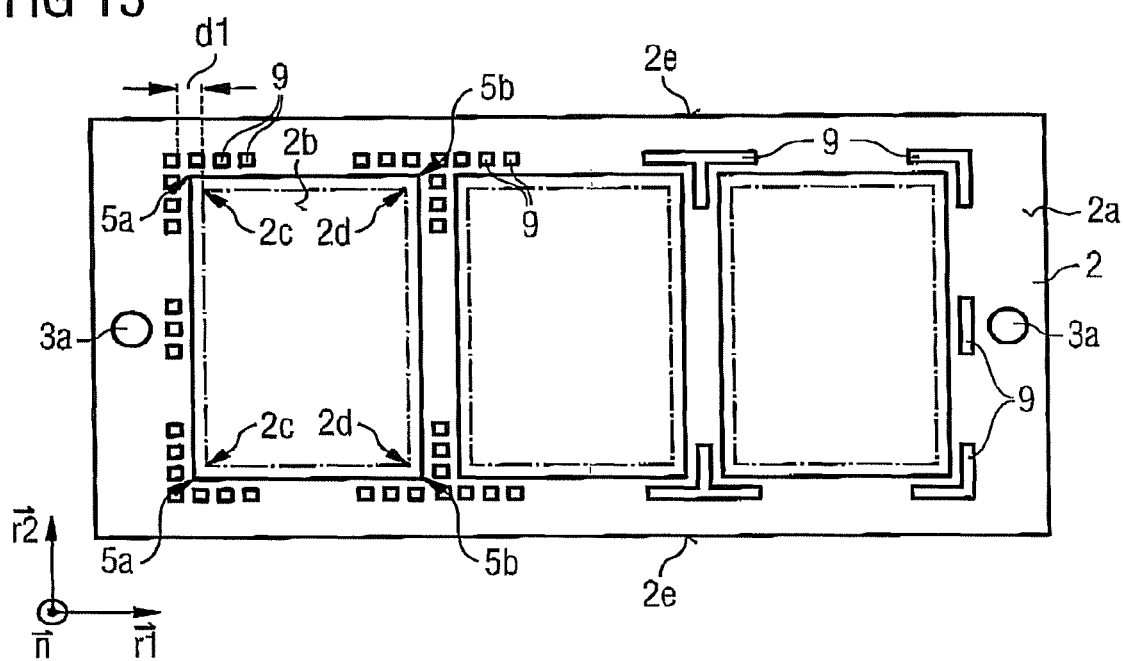
FIG. 15 illustrates an arrangement in accordance with FIG. 14 in which the fixing locations are arranged beside the center of the side areas of a circuit carrier.

While the fixing locations 3 are arranged in the region of the corners of the baseplate 2 in the exemplary embodiment in accordance with FIG. 14, they are situated centrally between the longitudinal sides 2e of the baseplate 2 in the exemplary embodiment in accordance with FIG. 15.

In order to reduce the von-Mises stresses proceeding from the fixing locations 3 in the case of fixing at a heat sink, a recess 9 is provided in the baseplate 2 between each of the fixing locations 3 and the circuit carrier 5 situated closest to the relevant fixing location 3.

The von-Mises stresses acting on the second connecting layer may be effectively reduced by the recesses 9 in the baseplate 2.

Figure 1:
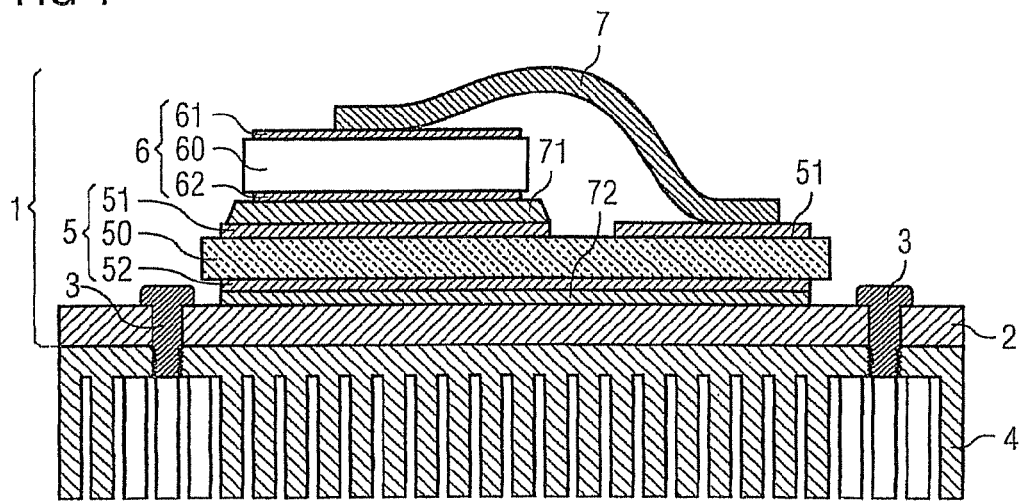
FIG. 1 illustrates a cross section through a power semiconductor module fixed at a heat sink.
Figure 2:
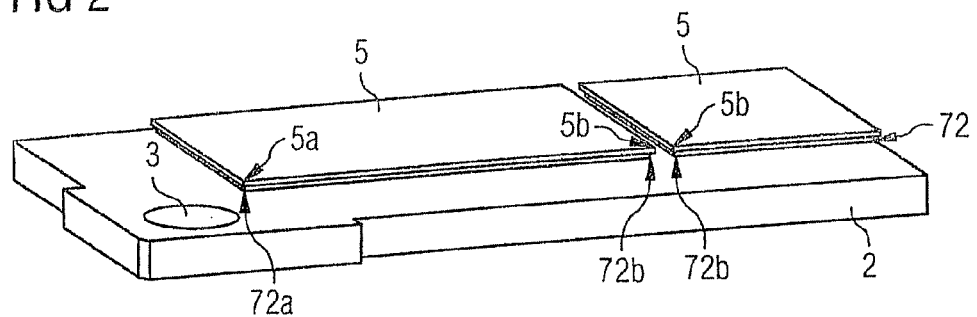
FIG. 2 illustrates a perspective view of a quarter model of a baseplate which is fixedly connected to a circuit carrier by means of a connecting layer.
Figure 3:
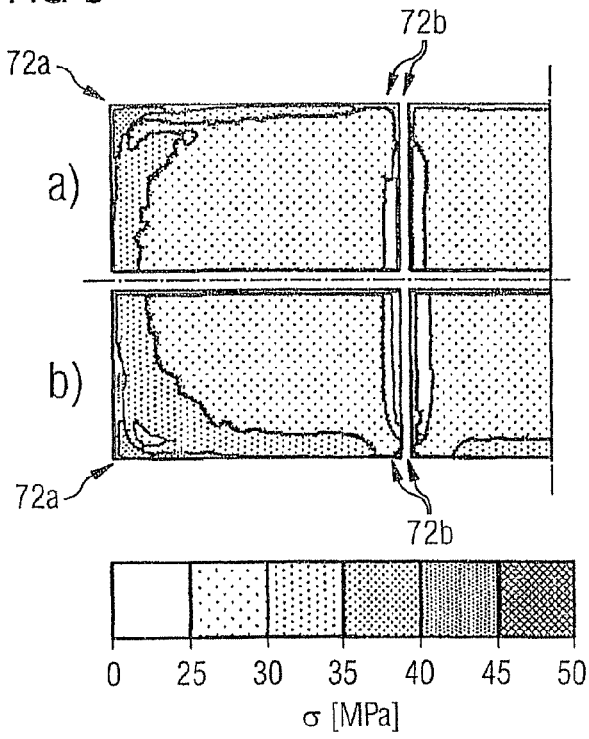
FIG. 3 illustrates a diagram of forces with von-Mises forces such as occur in the region of that interface of the second connecting layer of the arrangement in accordance with FIG. 2 which faces the baseplate and the circuit carrier, respectively.
Figure 4A:
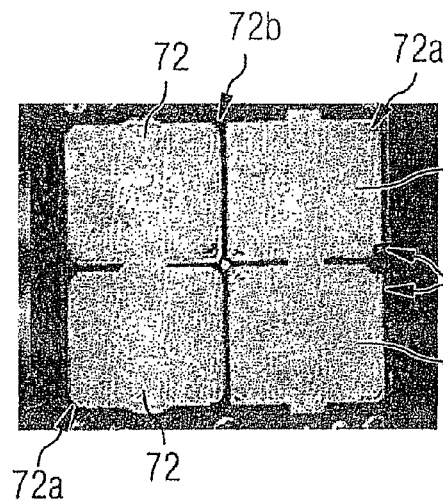
FIGS. 4A-4D illustrate the course of a delamination process in a power semiconductor module depending on the number of temperature change cycles undergone on the basis of ultrasound examinations.
Figure 4B:
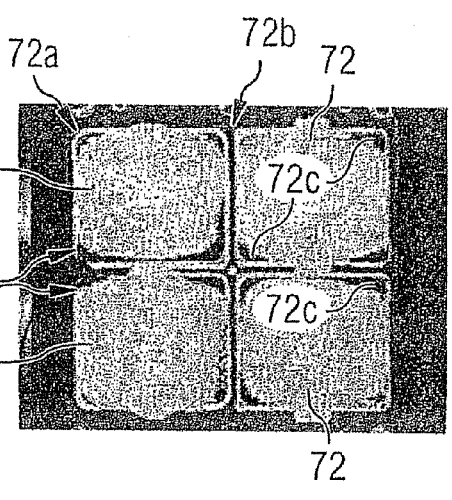
Figure 4C:
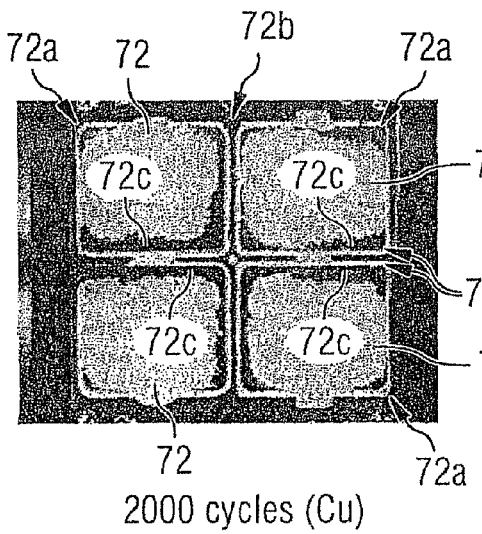
Figure 4D:
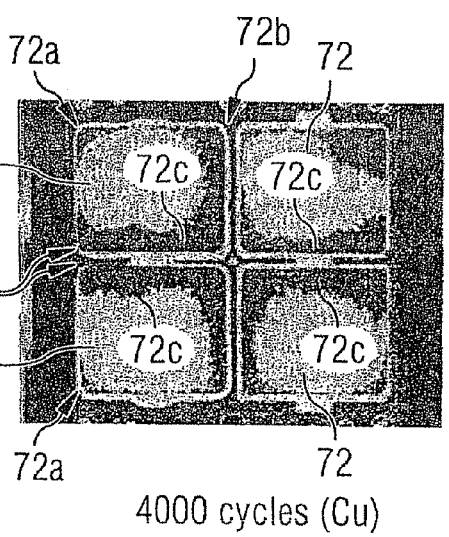
Figure 5:
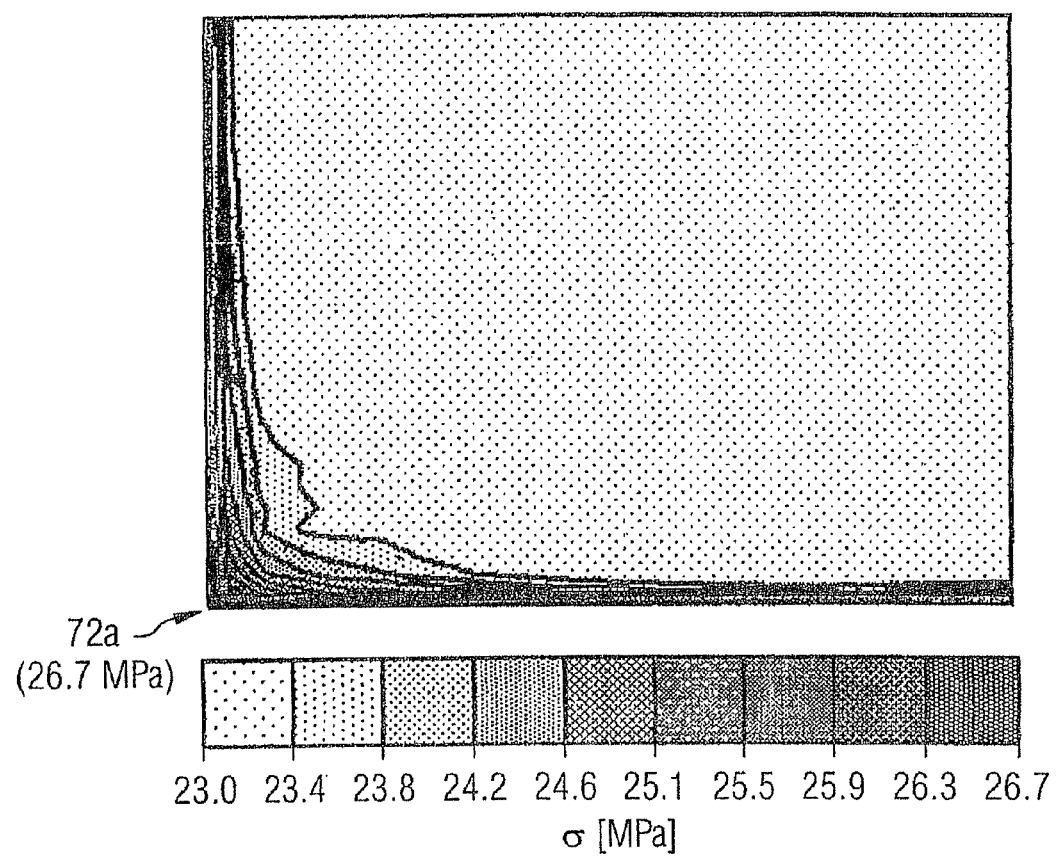
FIG. 5 illustrates the profile of the von-Mises stresses at that side of the second connecting layer which faces the baseplate in the region of an outer corner of a circuit carrier.
Figure 6:
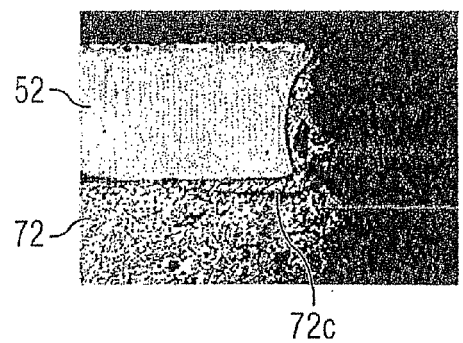
FIG. 6 illustrates a cross section through an edge-side portion of the second metallization layer of a circuit carrier with adjoining connecting layer with incipient cracking in a power semiconductor module.
Figure 16:
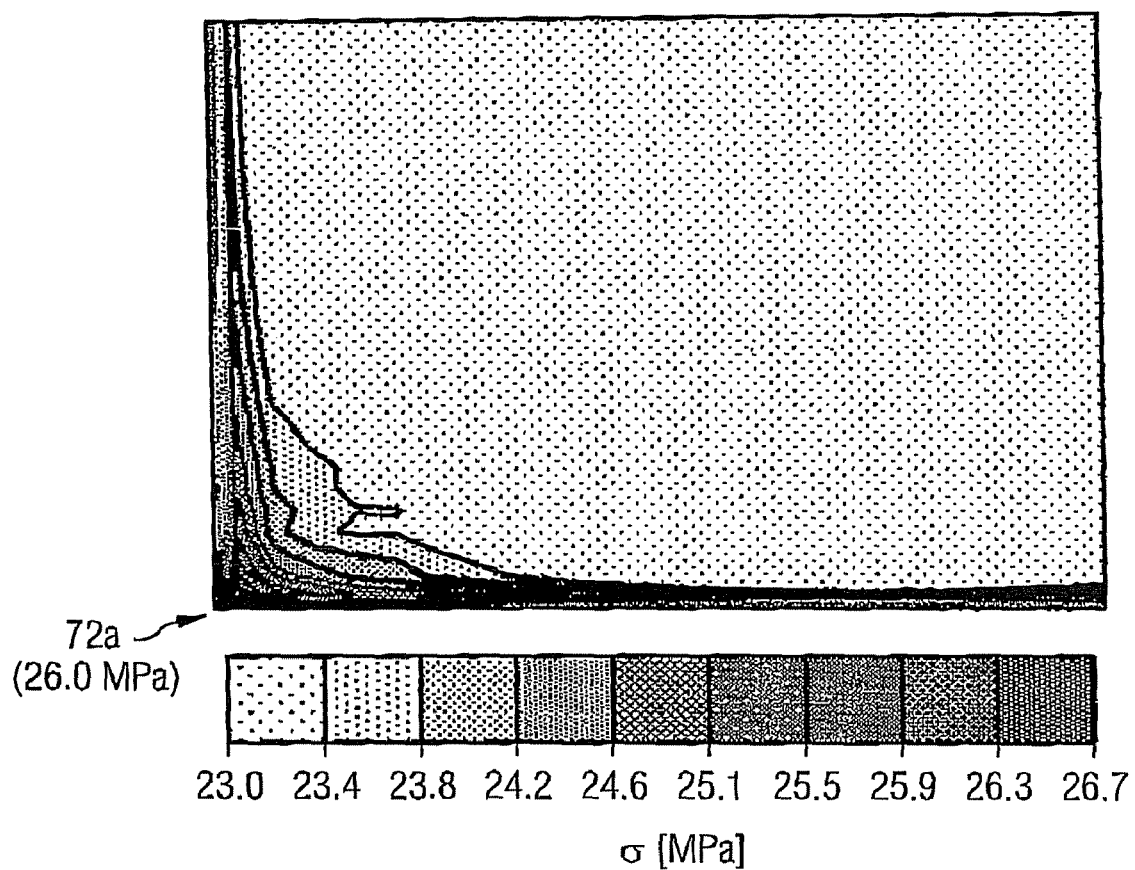
FIG. 16 illustrates the profile of the von-Mises stresses at that side of the second connecting layer which faces the baseplate in the region of an outer corner of a circuit carrier corresponding to FIG. 5, but in a power semiconductor module according to the embodiment whose baseplate is provided with a recess according to the arrangement in accordance with FIG. 12.

FIG. 16 illustrates by way of example the profile of the von-Mises stresses σ in the second connecting layer 72 corresponding to FIG. 5 in the region of an outer corner 72a, a recess according to an embodiment additionally being provided in the baseplate around the outer corner 5a. It can be seen therefrom that the maximum value of the von-Mises stresses σ includes decreased relative to the corresponding maximum value from 26.7 MPa to 26.0 MPa, that is, by more than 2.6%. Moreover, it can be seen that a reduction of the von-Mises stresses σ also occurs in the inner region of the second connecting layer.

Figure 17:
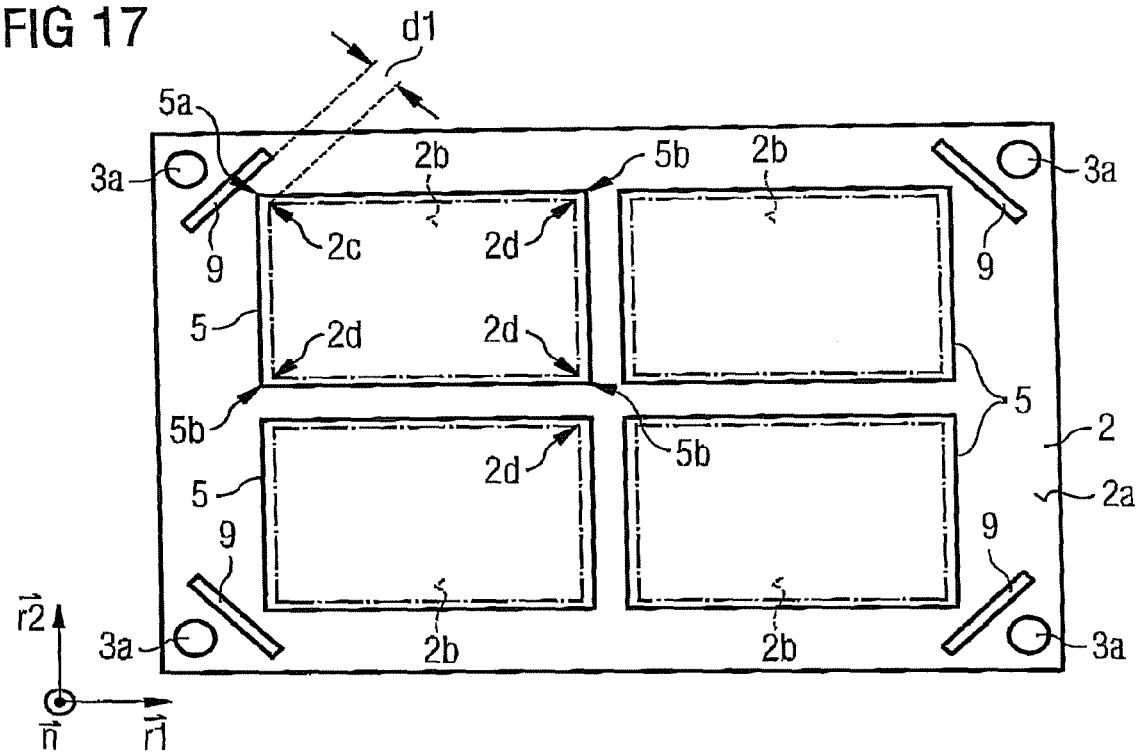
FIG. 17 illustrates a plan view of the baseplate of a power semiconductor module corresponding to FIG. 12 in which the recesses are formed in elongate and straight fashion and run at angles of greater of 0° and less than 90° with respect to the outer edges of the circuit carriers.

While the recesses 9 in the exemplary embodiments in accordance with FIGS. 12 to 15 run at least in portions parallel to one of the sides of the circuit carriers, in the exemplary embodiment in accordance with FIG. 17 in the plan view they run at an angle of greater than 0° and less than 90° with respect to each side of the circuit carrier 5 situated closest to the relevant recess 9 which form the outer corner 5a facing the relevant recess 9. In this exemplary embodiment, the recess 9 is arranged, in the plan view of the front side 2a of the baseplate 2, between an outer corner 5a of a circuit carrier 5 and the fixing location 3 situated closest to the relevant outer corner 5a.

Figure 18:
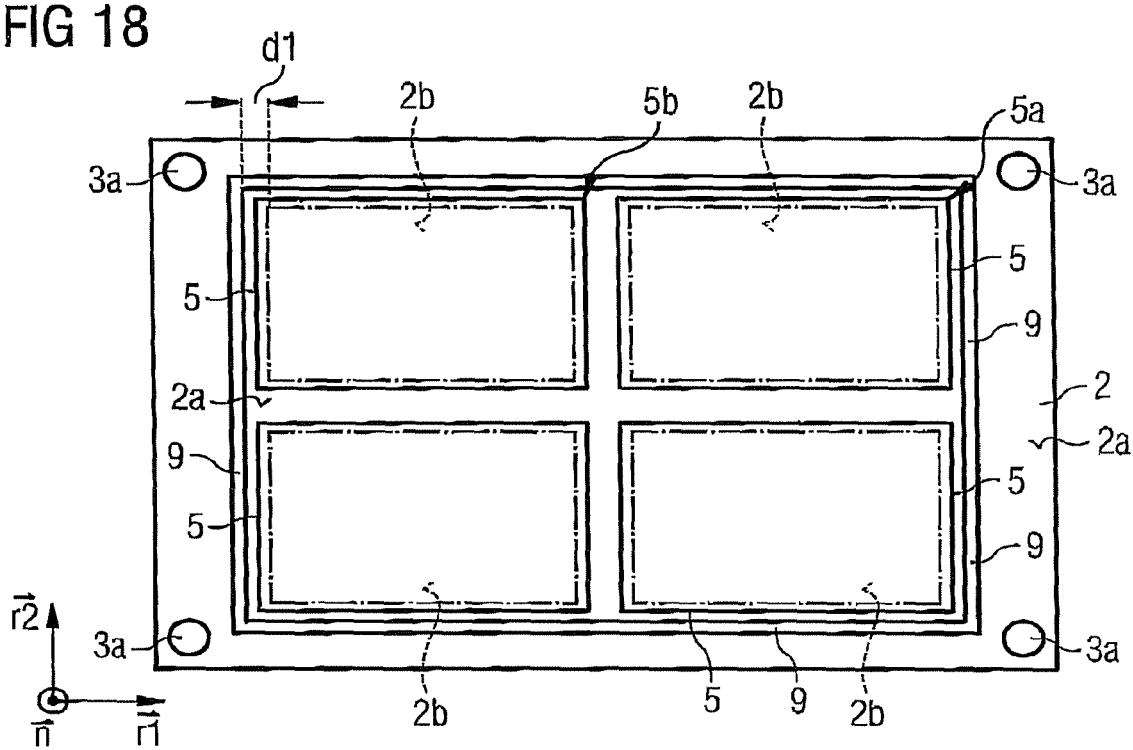
FIG. 18 illustrates a plan view of the baseplate of a power semiconductor module with a plurality of circuit carriers fixed on a baseplate, in which the recess is formed in ring-shaped fashion in the baseplate and arranged around the circuit carriers.
Figure 19:
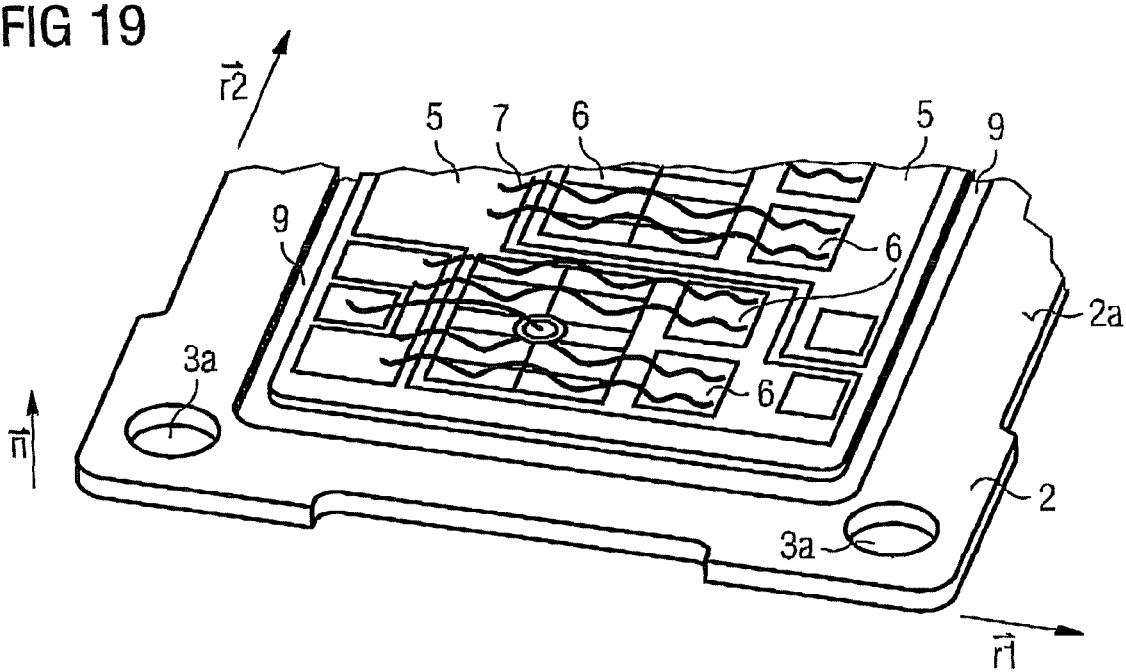
FIG. 19 illustrates a perspective view of a portion of a baseplate according to an embodiment, provided with equipped circuit carriers, corresponding to FIG. 18.

In accordance with an exemplary embodiment illustrated in FIG. 18, a recess 9 may also be formed in ring-shapedly closed fashion and be arranged around the connecting areas 2b of the baseplate 2 of a plurality of circuit carriers 5. FIG. 19 illustrates a portion of such an arrangement in a perspective view.

Figure 20:
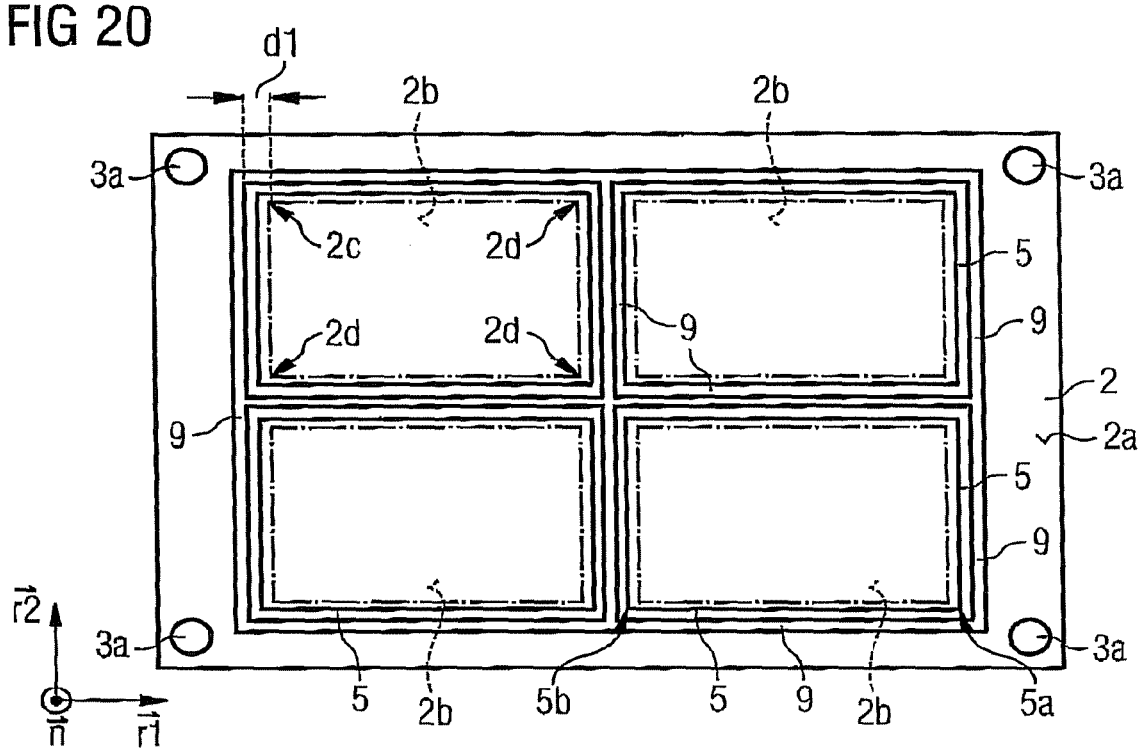
FIG. 20 illustrates a plan view of the baseplate of a power semiconductor module in accordance with FIG. 18 in which recesses arranged between adjacent circuit carriers are additionally arranged in the baseplate, such that individual circuit carriers are in each case surrounded by a ring-shapedly closed recess.

As can be seen from FIG. 20, in the case of a plurality of circuit carriers 5 connected to the same baseplate 2, the connecting areas 2b of individual circuit carriers 5 may in each case be surrounded by a ring-shapedly closed recess 9. In this case, ring-shapedly closed recesses 9 around adjacent circuit carriers 5 may be utilized jointly in portions. It is likewise possible for a plurality of recesses 9 formed in ring-shaped fashion also to be arranged in a manner spaced distant from one another.

The profile and intensity of the von-Mises stresses within a second connecting layer are determined by the geometry thereof. Peak values of the von Misses stresses occur primarily at the locations at which the second connecting layer and hence also the connecting area include a small edge curvature.

Therefore, one embodiment provides recesses in the baseplate primarily in the region of the locations at which the radius of curvature of the edge of the connecting area falls below a predetermined value.

Figure 21:
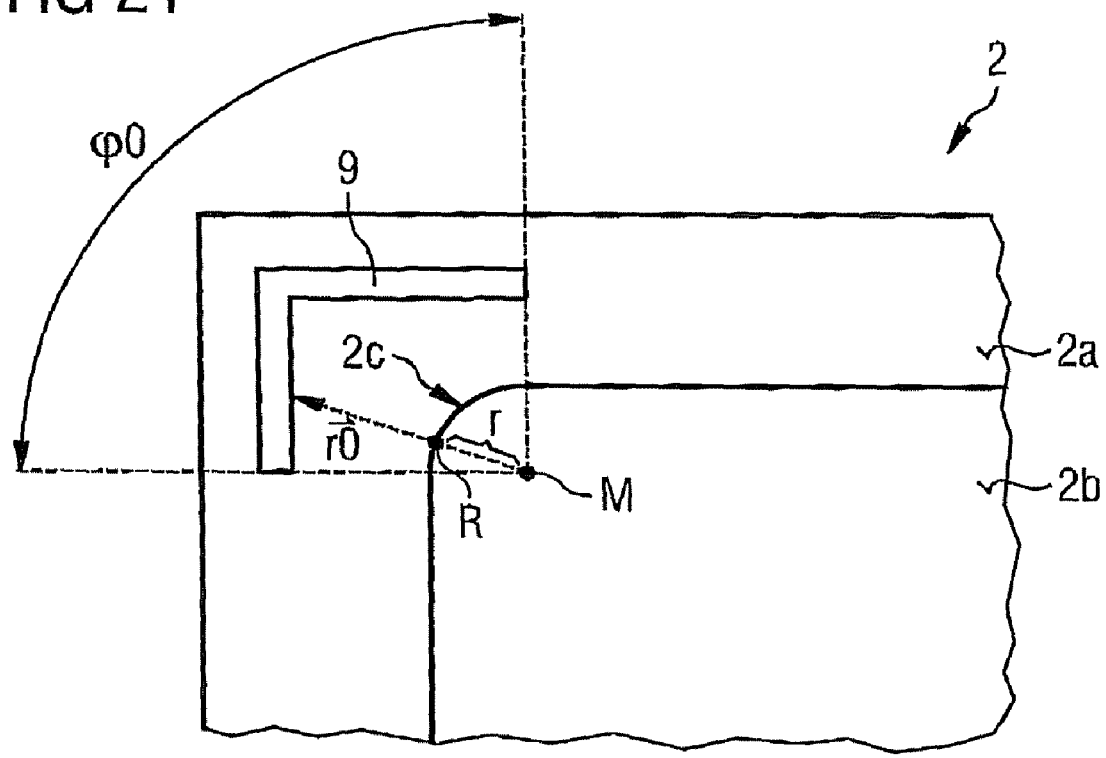
FIG. 21 illustrates a plan view of a portion of a baseplate of a power semiconductor module according to the embodiment which includes a connecting area including an edge whose radius of curvature at least one edge point falls below a predetermined value, wherein, at a distance from the connecting area, a recess is arranged in the baseplate in such a way that a straight line through the edge point and the centre of curvature assigned to said edge point crosses the recess in the plan view of the front side of the baseplate.

An exemplary embodiment in this respect is illustrated in FIG. 21. An outer corner 2c of a connecting area 2b is arranged near an outer corner of a baseplate 2. Each edge point R of the edge of the connecting area 2b may be individually assigned a radius r of curvature and a center M of curvature. In the limiting case, a radius r of curvature may also become infinite.

FIG. 21 illustrates the special case in which the edge is formed in portions as a quarter circle, such that, in all the edge points R situated on this edge portion, the radii r of curvature and centers M of curvature assigned to said edge points are identical.

Independently of the special case mentioned, in the case in which the radius r of curvature assigned to an edge point R falls below a predetermined value, for example 0 mm to 10 mm, a recess 9 may be provided which is arranged outside the connecting area 2b and which, in the plan view of the front side 2a of the baseplate 2, is situated behind the edge point R in a radial direction r0 with respect to the relevant edge point R proceeding from the center M of curvature assigned to the relevant edge point R.

To put it another way, in the plan view, the straight line running through the edge point R and the associated center M of curvature intersects the recess 9.

If all of the radii of curvature assigned to a continuous portion of the edge of the connecting area 2b exceed said predetermined value, then it follows from this that the recess 9 extends over a specific minimum angle φ0 in the plan view of the front side 2a. In this case, the vertex of the minimum angle φ0 is given by the center M of curvature assigned to the smallest radius of curvature that occurs in the edge portion.

In the case where an edge portion includes the smallest radius of curvature at a plurality of locations, a minimum angle φ over which the recess 9 at least extends may be assigned to each of the centers M of curvature assigned to said locations.

The criteria described in FIG. 21 using the example of an outer corner 2c of the connecting area 2b may be applied in the same way to any desired edge location or to any desired edge portion of the connecting area 2b, to the region of inner corners 2d, as illustrated by way of example in FIGS. 12 to 15, 17, 18 and 20.

Figure 22:
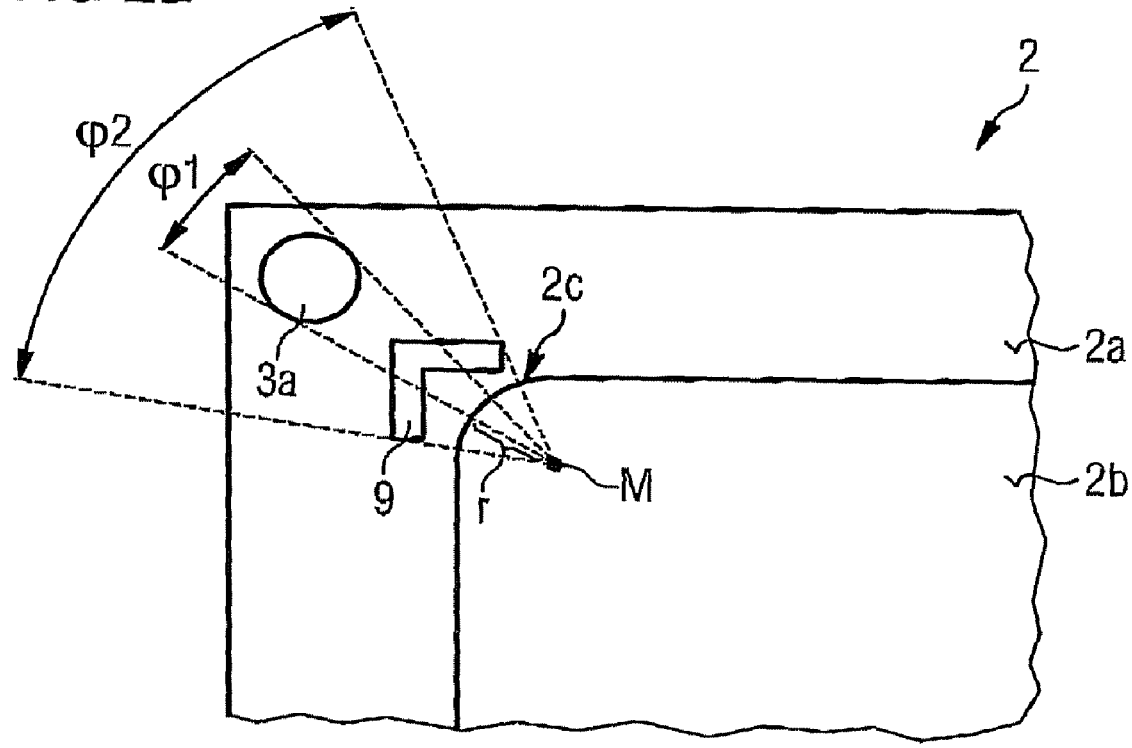
FIG. 22 illustrates a plan view of a portion of a baseplate of a power semiconductor module according to an embodiment which includes a connecting area, a fixing location spaced distant from the latter, and also a recess arranged between the connecting area and the fixing location, wherein the fixing location, in the plan view of the front side of the baseplate, proceeding from the center of curvature of a location at which the radius of curvature of the edge of the connecting area falls below a predetermined value, appears under an angular range which is arranged completely within the angular range under which the recess appears from the same center of curvature.

FIG. 22 illustrates a plan view of a portion of a baseplate 2 of a power semiconductor module according to an embodiment which includes a connecting area 2b, a fixing location 3 spaced distant from the latter, and also a recess 9 arranged between the connecting area 2b and the fixing location 3.

A radius r of curvature and a center M of curvature may be assigned to each edge point of the connecting area 2b. Proceeding from said center M of curvature, in the plan view of the front side 2a, the fixing location 3 appears at an angle φ1 and the recess 9 appears at an angle φ2.

For the case where the radius of curvature to which the center M of curvature is assigned falls below a predetermined value, for example 0 mm to 10 mm, the recess 9 may be chosen such that the range of the angle φ1 does not lie outside the range of the angle φ2. This means that a location at which the edge of the connecting area 2b falls below a predetermined radius of curvature is shielded from the influences of the fixing location by the recess 9.

The illustration of components present in the power semiconductor module was dispensed with in part in the previous figures for reasons of clarity. In FIGS. 12 to 15, 17, 18 and 20, this concerns the population and interconnection of the circuit carrier 5, a housing of the power semiconductor module and also external connections.

Figure 23:
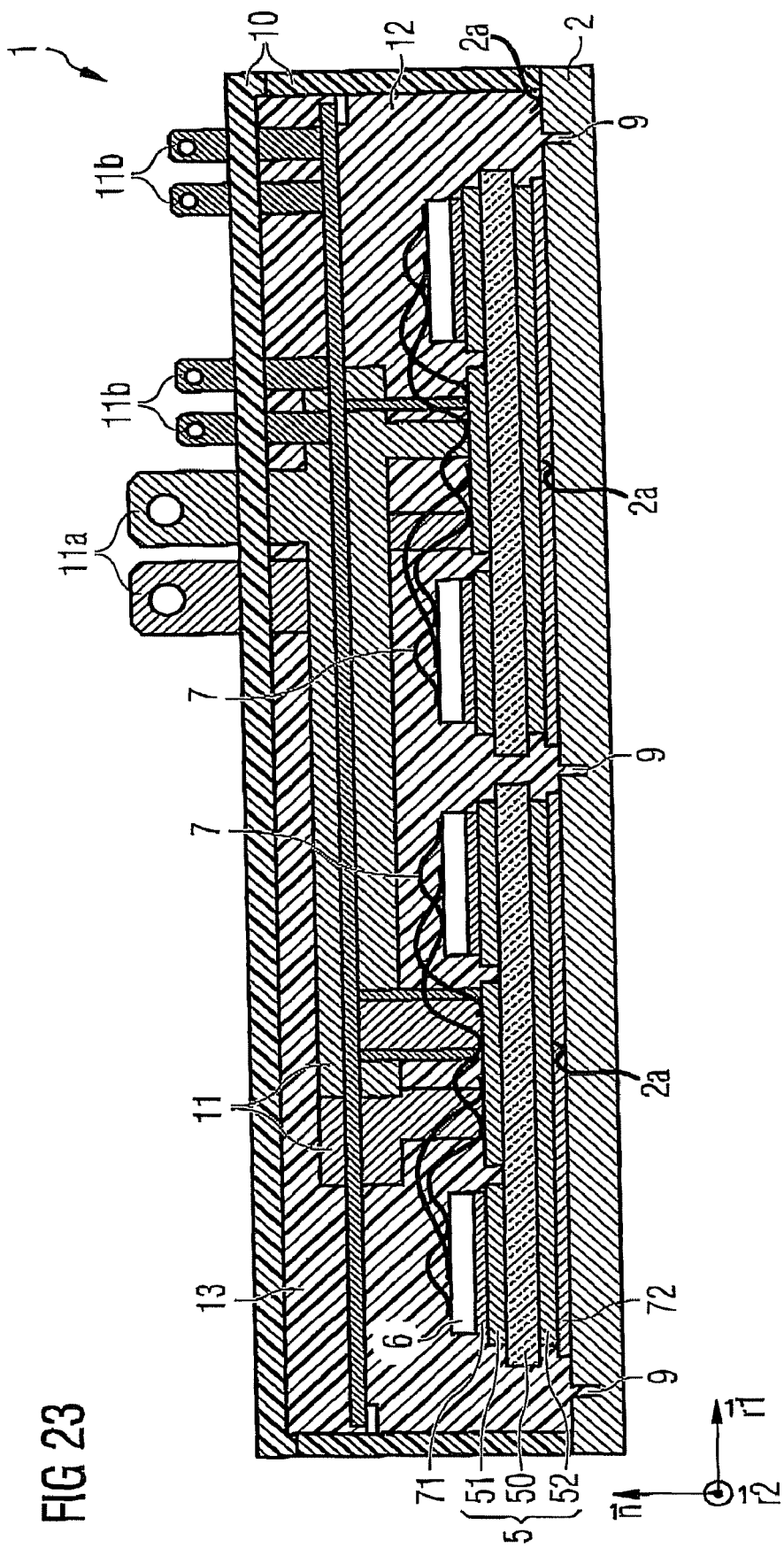
FIG. 23 illustrates a vertical section through a potted power semiconductor module according to an embodiment which is provided with a housing and whose baseplate is provided with recesses and also with fixing locations and which includes a busbar arrangement for its internal interconnection.

Therefore, FIG. 23 illustrates by way of example a vertical section through a power semiconductor module 1 with more details.

This cross-sectional view reveals two circuit carriers 5 fixed on a baseplate 2 by means of a second connecting layer 72. The baseplate 2 includes recesses 9 which may be arranged in the manner described above.

Furthermore, various recesses 9 formed in each case as desired may be provided at different locations on the baseplate 2. In individual geometries from among the geometries of the recess 9 which are illustrated in the various exemplary embodiments may be used in mixed fashion on the same baseplate 2.

In order to ensure the mechanical stability, to prevent the penetration of dirt and moisture and to increase the insulation strength of the power semiconductor module 1, it may include a housing 10 and/or be potted with a potting composition.

In the exemplary embodiment in accordance with FIG. 23, the baseplate 2 forms a component part of the housing 10. The power semiconductor module 1 is additionally potted with a soft potting composition 12 and with a hard potting composition 13.

In this case, the soft potting composition 12 extends from the front side 2a of the baseplate 2 to at least over the top sides of the semiconductor chips 6 or to at least over the bonding wires 7. The hard potting composition 13 is arranged above the soft potting composition 12 on that side of the latter which is remote from the baseplate 2.

A busbar arrangement 11 is provided for externally making contact with the power semiconductor module 1, said busbar arrangement being electrically conductively connected at least to the first metallization layers 51 of the circuit carriers 5, for example, by means of a soldering connection. Such a busbar arrangement 11 makes it possible, for the various equipped circuit carriers 5 of the power semiconductor module 1 to be electrically interconnected with one another.

Busbar arrangements 11 with external control connection lugs 11b, and also load-current-carrying busbar arrangements 11 with external load connection lugs 11a are provided in this case. The electrical connection between the semiconductor chips 6 and the busbar arrangements 11 is effected by means of bonding wires 7 either directly or indirectly via portions of the first metallization layers 51.

Figure 24:
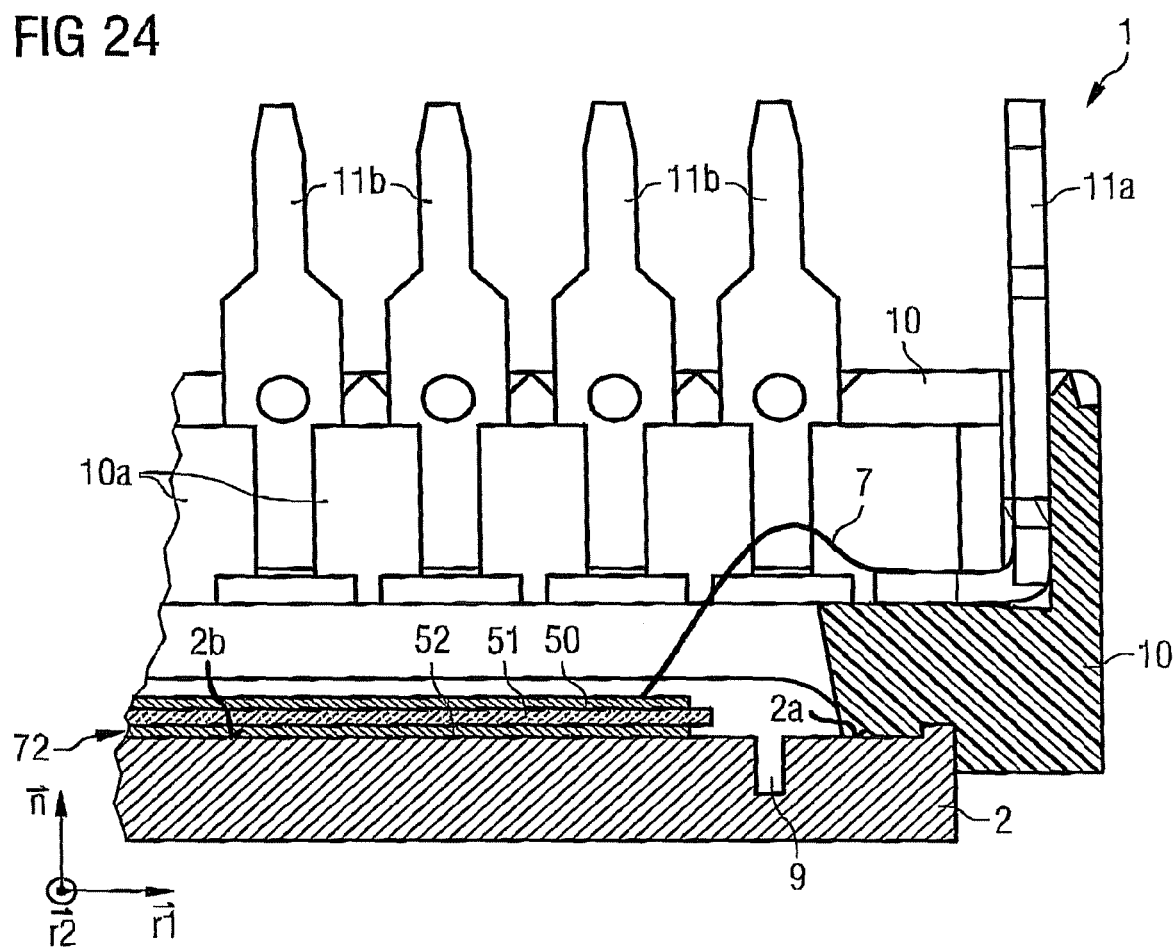
FIG. 24 illustrates a vertical section through a portion of a power semiconductor module according to an embodiment whose baseplate includes recesses and fixing locations and which is provided with a housing on whose inner wall guide rails are integrally formed, into which connection lugs are inserted or latched for the external connection of the module.

Instead of or in addition to such a busbar arrangement 11, the external connection lugs 11a and/or 11b may also be provided as separate elements, as is illustrated by way of example in FIG. 24 on the basis of a vertical section through a portion of a power semiconductor module 1 according to an embodiment.

The power semiconductor module 1 includes external load connection lugs 11a and also external control connection lugs 11b, which are plugged and optionally latched into guide rails 10a formed on the inner wall of the housing 10. At their lower end, the connection lugs 11a, 11b are angled by 90° in order to form base regions. The base regions bear on a projection of the housing 10 and may thereby be electrically conductively connected to a semiconductor chip or a portion of the first metallization 51 of a substrate 5 by means of a bonding connection.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An arrangement comprising:
a circuit carrier having a first and a second surface;
a connecting layer having a first and a second surface, the first surface of the connecting layer coupled to the second surface of the circuit carrier;
a baseplate with a first surface, the first surface of the baseplate connected to the second surface of the connecting layer at a connecting area;
a heat sink coupled to the baseplate;
means on the baseplate for connecting the baseplate to the heat sink; and
a recess extending into the baseplate proceeding from the first surface of said baseplate and adjacent the connecting area;
wherein an edge of the connecting area comprises at an edge point a radius of curvature that falls below a predetermined first minimum value, wherein the recess of the baseplate is at least partly arranged outside the connecting area and which is arranged on a common straight line with the edge point and the center of curvature assigned to said edge point in the plan view of the front side of the baseplate.

2. The semiconductor module of claim 1, wherein the distance between the recess and the connecting area is selected to reduce the mechanical stresses.

3. A semiconductor module comprising:
a circuit carrier having a first and a second surface;
a connecting layer having a first and a second surface, the first surface of the connecting layer coupled to the second surface of the circuit carrier;
a baseplate with a first surface, the first surface of the baseplate connected to the second surface of the connecting layer at a connecting area;
a fixing location in the baseplate for connecting the baseplate to a heat sink; and
a recess extending into the baseplate proceeding from the first surface of the baseplate, and arranged between the fixing location and the connecting area;
wherein an edge of the connecting area comprises at an edge point a radius of curvature that falls below a predetermined first minimum value, wherein the recess of the baseplate is at least partly arranged outside the connecting area and which is arranged on a common straight line with the edge point and the center of curvature assigned to said edge point in the plan view of the front side of the baseplate.

4. The semiconductor module of claim 3, wherein the distance between the recess and the connecting area is selected to reduce the mechanical stresses.

5. The semiconductor module of claim 3, wherein the distance between the fixing location and the connecting area is selected to reduce the thermomechanical stresses.

6. A semiconductor module comprising a baseplate and a circuit carrier, which is fixedly connected to the baseplate by means of a connecting layer, wherein the baseplate comprises:
a connecting area given by a common interface between the connecting layer and the baseplate;
a fixing location, by means of which the baseplate can be connected to a heat sink; and
a recess, which is arranged in a lateral direction between the fixing location and the connecting area and extends into the baseplate proceeding from that side of said baseplate which faces the circuit carrier;
wherein an edge of the connecting area comprises at an edge point a radius of curvature that falls below a predetermined first minimum value, wherein the recess of the baseplate is at least partly arranged outside the connecting area and which is arranged on a common straight line with the edge point and the center of curvature assigned to said edge point in the plan view of the front side of the baseplate.

7. The semiconductor module of claim 6, wherein the recess is arranged in the lateral direction between the fixing location and a location at which the connecting area comprises a radius of curvature of less than 10 mm.

8. The semiconductor module of claim 6, wherein the recess is formed as a continuous opening of the baseplate.

9. The semiconductor module of claim 6, wherein the recess comprises a depth of at least 1 mm.

10. The semiconductor module of claim 6, wherein the recess comprises a width of 10% to 100% of the thickness of the baseplate.

11. The semiconductor module of claims 6, wherein the recess comprises a width of 0.5 mm to 5 mm.

12. The semiconductor module of claim 6, wherein the recess is arranged in ring-shapedly closed fashion around the connecting area.

13. The semiconductor module of claim 6, wherein the distance between the recess and the connecting area in the lateral direction is less than or equal to 3 mm.

14. The semiconductor module of claim 6, wherein the distance between the fixing location and the connecting area in the lateral direction is less than or equal to 3 mm.

15. The semiconductor module of claim 6, wherein the predetermined first minimum value is 0 mm to 10 mm.

16. The semiconductor module claim 6, wherein the fixing location is formed as a continuous opening of the baseplate.

17. The semiconductor module of claim 6, wherein the fixing location is given by a location at which the baseplate is connected to a bolt in a releasable or non-releasable manner.

18. The semiconductor module of claim 6, wherein the fixing location is given by a location at which the baseplate comprises a projection formed as a fixing element.

19. The semiconductor module of claim 6, wherein the recess is formed as a non-continuous trench of the baseplate.

20. The semiconductor module of claim 19, wherein the recess comprises a depth of at least 30% of the thickness of the baseplate.

21. The semiconductor module of claim 6, wherein the edge of the connecting area comprises at an edge point a radius of curvature that falls below a predetermined second minimum value, wherein, in the plan view of the front side of the baseplate the fixing location, preceding from a center of curvature corresponding to the radius of curvature, appears under an angular range arranged completely within the angular range under which the recess appears preceding from the center of curvature.

22. The semiconductor module of claim 21, in which the predetermined second minimum value is 0 mm to 10 mm.

23. The semiconductor module of claim 22, wherein the fixing location comprises an internal thread.

\* \* \* \* \*